(12) United States Patent
Nakasuji et al.

(10) Patent No.: US 7,256,405 B2
(45) Date of Patent: Aug. 14, 2007

(54) SAMPLE REPAIRING APPARATUS, A SAMPLE REPAIRING METHOD AND A DEVICE MANUFACTURING METHOD USING THE SAME METHOD

(75) Inventors: Mamoru Nakasuji, Kanagawa-ken (JP); Takao Kato, Tokyo (JP); Tohru Satake, Kanagawa-ken (JP); Kenji Terao, Kanagawa-ken (JP); Takeshi Murakami, Tokyo (JP); Nobuharu Noji, Kanagawa-ken (JP)

(73) Assignee: Ebara Corporation, Tokyo (JP)

( * ) Notice: Subject to any disclaimer, the term of this patent is extended or adjusted under 35 U.S.C. 154(b) by 205 days.

(21) Appl. No.: 11/037,093

(22) Filed: Jan. 19, 2005

(65) Prior Publication Data

US 2005/0211925 A1 Sep. 29, 2005

(30) Foreign Application Priority Data

Jan. 20, 2004 (JP) ............................. 2004-011787

(51) Int. Cl.
*H01J 37/30* (2006.01)
*G21K 5/10* (2006.01)
(52) U.S. Cl. ...................... 250/492.22; 250/492.2; 250/492.3; 250/396 R; 250/306; 250/310
(58) Field of Classification Search .................... None
See application file for complete search history.

(56) References Cited

U.S. PATENT DOCUMENTS

| 5,429,730 A | * | 7/1995 | Nakamura et al. ...... 204/192.34 |
| 6,392,333 B1 | * | 5/2002 | Veneklasen et al. ..... 313/361.1 |
| 2005/0045821 A1 | * | 3/2005 | Noji et al. ................... 250/311 |
| 2005/0263715 A1 | * | 12/2005 | Nakasuji et al. ...... 250/396 ML |

* cited by examiner

*Primary Examiner*—Nikita Wells
(74) *Attorney, Agent, or Firm*—Westerman, Hattori, Daniels & Adrian, LLP.

(57) ABSTRACT

An object of the present invention is to provide a sample repairing apparatus, a sample repairing method and a device manufacturing method using the same method, which can reduce an edge roughness in a repaired pattern and also can provide the repairing of a sample by applying an electron beam-assisted etching or an electron beam-assisted deposition. There is provided a sample repairing method comprising: (a) a step of focusing an electron beam by an objective lens to irradiate a sample: (b) a step of supplying a reactive gas onto an electron beam irradiated surface of said sample: (c) a step of selectively scanning a pattern to be repaired on said sample with the electron beam so as to repair said pattern by applying an etching or a deposition; and (d) a step of providing a continuous exhausting operation by means of a differential exhaust system arranged in said objective lens so as to prevent the reactive gas supplied onto said electron beam irradiated surface from flowing toward an electron gun side.

17 Claims, 6 Drawing Sheets

SAMPLE REPAIRING APPARATUS, A SAMPLE REPAIRING METHOD AND A DEVICE MANUFACTURING METHOD USING THE SAME METHOD

BACKGROUND OF THE INVENTION

The present invention relates to a sample repairing apparatus and a sample repairing method for repairing a defect with high accuracy in a sample, such as a mask, used in the production of a device or the like having a line width equal to or less than 0.1 µm, and further to a device manufacturing method using such a sample repairing method.

There has been a known method in the prior art, in which a sample, such as a mask, is irradiated with a finely focused electron beam and then a reactive gas is blown to the irradiated region thereof with a nozzle so as to carry out the etching of the sample.

When the mask subject to the repairing has the minimum line width as narrow as about 90 nm, the edge roughness in the repaired pattern should be controlled to be of the order of some ten nm or less, which in turn requires to focus the beam to be half a size of the required roughness or smaller than that. On the other hand, from the reason that the electron beam, if having a higher landing energy, could cause a back scattering after an incidence upon the sample and the reflected beam thereof could emit secondary electrons to contribute to the etching, there is another problem that a precision of processing would be not greater than that limited by the extent of the back scattered electrons.

Besides, it has been a main stream to use an ion beam for repairing the mask in the prior art. The repairing apparatus employing the focused ion beam has a problem that an ion implantation to a mask substrate or a damage from an irradiation beam could deteriorate a transmittance in a silica substrate, substantially inhibiting the repair of opaque defect from being carried out, which is considered to be a serious problem especially in the $F_2$ lithography.

REFERENCE

[Non-Patent Document]

A set of advance copies from the NEXT GENERATION LITHOGRAPHY WORKSHOP (NGL2003), Jul. 10 and 11, 2003, National Museum of Emerging Science and Innovation, "Next generation Electron Beam mask repair tool", Dr. Jayant Neogi, Johannes Bihr and Klaus Edinger, hosted by: Silicon Technology Subcommittee, Next Generation Lithography Technology Workshop, Japan Society of Applied Physics, co-hosted by: No. 132 committee, "Industrial Application of Charged Particle Beam", Japan Society of the Promotion of Science.

SUMMERY OF THE INVENTION

The present invention has been made in the light of the above-pointed problems pertaining to the prior art, and an object thereof is to provide a sample repairing apparatus, a sample repairing method and a device manufacturing method using the same method, which can reduce an edge roughness in a repaired pattern and also can repair a sample by applying an electron beam-assisted etching or an electron beam-assisted deposition.

The present invention provides a sample repairing method, comprising: (a) a step of focusing an electron beam by an objective lens to irradiate a sample; (b) a step of supplying a reactive gas onto an electron beam irradiated surface of said sample; (c) a step of selectively scanning a pattern to be repaired on said sample with the electron beam so as to repair said pattern by applying an etching or a deposition; and (d) a step of providing a continuous exhausting operation by means of a differential exhaust system arranged in said objective lens so as to prevent the reactive gas supplied onto said electron beam irradiated surface from flowing toward an electron gun side. Further, it is more preferred that said sample may be applied with a negative voltage. Further, preferably a landing energy of the electron beam may be equal to or less than 3 keV. Further, said focused electron beam may define a shaped beam that has been shaped into a rectangle having parallel sides in the x-direction and in the y-direction, or a shaped beam that has been shaped into a rectangle having sides inclined at predetermined angles (e.g., 45 degrees) relative to the x-direction and the y-direction.

The present invention provides another sample repairing method, comprising: (a) a step of transmitting an electron beam emitted from an electron gun through an objective lens to irradiate a sample; (b) a step of obtaining an image of said sample surface; (c) a step of searching for a region to be repaired on said sample from said image of said sample surface and scanning said region to be repaired by the electron beam: (d) a step of increasing a pressure of a reactive gas in said region on said sample subject to the scanning with the electron beam; and (e) a step of confirming the completion of said repairing of said sample, wherein a small aperture for limiting the pressure is disposed between said sample and said objective lens. Further, more preferably said electron gun has a ZrO/W Schottky cathode or a TaC cathode, and an electron beam emitted in the direction having a certain angle with respect to an optical axis is used. Further, It is more preferred that said objective lens for focusing said electron beam to be finer comprises a magnetic lens having a magnetic gap formed in the sample side thereof and an axially symmetric electrode disposed in the sample side of said magnetic lens and having a potential higher than that of the sample. Yet further, an E×B separator may be provided in the electron gun side of said objective lens or inside said objective lens, and said step of obtaining the image of said sample surface may include a step of deflecting secondary electrons emitted from said sample, by said E×B separator and detecting said secondary electrons by a detector to thereby obtain the image of said sample surface.

Further, the present invention provides a device manufacturing method for carrying out a lithography by using a mask which has been repaired in accordance with the sample repairing method defined in any one of claim 1 through 8.

The present invention provides a sample repairing apparatus for repairing a sample, comprising: an objective lens for focusing an electron beam to Irradiate a sample; a gas supply for supplying a reactive gas onto an electron beam irradiated surface of said sample: and a differential exhaust system disposed in said objective lens and operative to keep exhausting the reactive gas so as to inhibit the reactive gas supplied onto said electron beam irradiated surface by said gas supply from flowing toward an electron gun side, wherein a pattern to be repaired on said sample is selectively scanned with an electron beam so as to repair said pattern by applying an etching or a deposition. Further, it is more preferred that said sample may be applied with a negative voltage. Further, preferably a landing energy of said electron beam may be equal to or less than 3 keV. In addition, the apparatus may further comprise a condenser lens located downstream to the electron gun and a shaping aperture plate located upstream or downstream to said condenser lens, in which said shaping aperture plate comprises: a first shaping aperture for shaping said electron beam that has been focused by said condenser lens into a rectangle having parallel sides in the x-direction and in the y-direction; and a second shaping aperture for shaping said electron beam that has been focused by said condenser lens into a rectangle having sides inclined at predetermined angles (e.g., 45 degrees) relative to the x-direction and the y-direction, wherein said first shaping aperture and said second shaping aperture are switchable from each other.

The present invention provides another sample repairing apparatus for repairing a sample, comprising: an electron gun for emitting an electron beam; an objective lens for focusing said electron beam emitted from said electron gun to irradiate a sample; an image obtaining means for obtaining an Image of said sample surface: a gas supply for supplying a reactive gas onto an electron beam irradiated surface of said sample so as to increase a pressure of the reactive gas in the electron beam scanning region on said sample: and a small aperture disposed between said sample and said objective lens for limiting the pressure of said reactive gas, wherein a region to be repaired of said sample is searched for from said image of said sample surface, which has been obtained by said image obtaining means, and then said region to be repaired is scanned with the electron beam to repair it by applying an etching or a deposition. Further, preferably said electron gun has a ZrO/W Schottky cathode or a TaC cathode, and an electron beam emitted in the direction having a certain angle relative to the optical axis is used. Further, it is more preferred that said objective lens for focusing said electron beam to be finer comprises: a magnetic lens having a magnetic gap formed in a sample side thereof; and an axially symmetric electrode disposed in the sample side of said magnetic lens and having a potential higher than that of the sample. Furthermore, an E×B separator may be provided in the electron gun side of said objective lens or inside said objective lens, and said image obtaining means for obtaining the image of said sample surface obtains the image of the sample surface through the steps of deflecting secondary electrons emitted from said sample, by said E×B separator and detecting said secondary electrons by a detector.

According to the invention as defined In claim 1 or claim 10, the edge roughness in the repaired pattern can be reduced. Further, owing to the objective lens with a structure for the differential exhaust system, an amount of a reactive gas flowing into the electron gun side is reduced, thus reducing the number of cleaning operations of the optical column.

According to the invention as defined in claim 5 or claim 14, the repairing of the sample, such as a mask, can be carried out successfully by applying an electron beam-assisted etching or an electron beam-assisted deposition. Further, since the beam can be focused to be finer even during use (introduction) of the reactive gas, a fine-controlled repairing can be achieved.

Components in the attached drawings are designated as follows:

1 Zr-W tip
2 Schottky shield
3 Tip heating W filament
4 Condenser lens
5 Shaping aperture plate
6 Rectangular aperture
7 Rectangular aperture
8 NA aperture
9 Reduction lens
10 Objective lens system
11 High vacuum exhaust pipe
12 Low vacuum exhaust pipe
13 Gas Injection tube
14 Low vacuum exhaust pipe
15 Negative power supply
16 Mask
17 Cooling gas
18 B×B separator
19 Secondary electron detector (SE detector)
20 Deflector
21 Cr pattern
22 Opaque defect
23 Shaped beam
23 Shaped beam
26 Clear defect
31 Cathode
32 Wehnelt or Schottky shield
33 Anode
34 Condenser lens
35 Shaping aperture plate
36 Reduction lens
37 Electrostatic deflector
38 E×B separating and scanning electrostatic deflector
39 E×B separating deflector (electromagnetic deflector)
40 Objective lens
41 O ring
42 Magnetic gap
43 Small aperture
44 Axially symmetric electrode
45 Pressure wall
46 Pressure bulkhead
47 Mask
48 Guard ring
49 Exhaust pipe
50 Gas introducing tube
51 Locus
52 Secondary electron locus
53 Secondary electron detector (SE detector)
54 Pivot deflection
56 Aperture

DETAILED DESCRIPTION OF THE INVENTION

Figure 1:
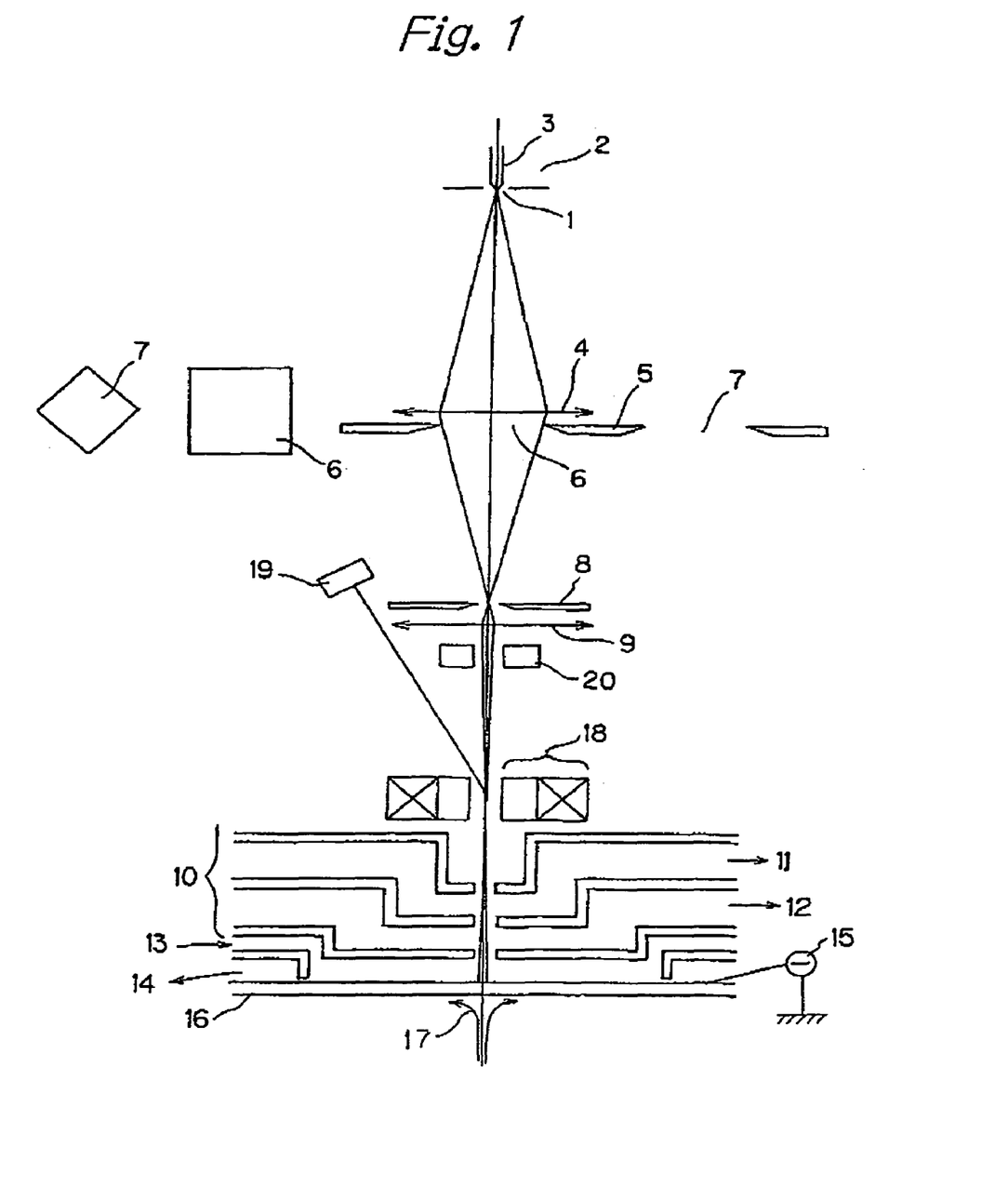
FIG. 1 is a schematic diagram of an exemplary electron beam apparatus (i.e., an electron beam optical column) to be used in a sample repairing method according to the present invention.

A best mode for carrying out a sample repairing apparatus, a sample repairing method and a device manufacturing method using the same method according to the present invention will now be described with reference to the attached drawings. FIG. 1 shows schematically an electron beam apparatus (i.e., an electron beam optical column) used in a repairing method of a sample, such as a mask and the like, according to the present invention. As illustrated, an electron gun comprises a Zr-W tip 1, a Schottky shield 2 and a tip heating W filament 3, taking advantage of Schottky emission. An electron beam emitted from this electron gun is focused with a condenser lens 4 to form a crossover image in an NA aperture 8.

A shaping aperture plate 5 serving as a shaping aperture Is disposed in a sample (mask) side of a condenser lens 4. The shaping aperture plate 5 includes a rectangular aperture (a first shaping aperture) having sides extending in parallel in the x-direction and the y-direction and another rectangular aperture (a second shaping aperture) 7 having sides angled at a predetermined angle of 45 degrees relative to the x-direction and the y-direction, each formed through the plate 5, in which the rectangular aperture 6 and the rectangular aperture 7 are adapted to be switched from each other by sliding and thereby moving the shaping aperture plate 5 or by deflecting the irradiating beam. Thus, the electron beam that has passed through the rectangular aperture 6 of the shaping aperture plate 5 forms a rectangular-shaped beam having its sides extending in parallel in the x-direction and the y-direction, while on the other hand, the electron beam that has passed through the rectangular aperture 7 having its sides angled at 45 degrees relative to the x-direction and the y-direction forms a rectangular-shaped beam having its sides angled at 45 degrees relative to the x-direction and the y-direction. It is to be noted that the illustrated embodiment represents a case of the electron beam passing through the rectangular aperture 6. Although the rectangular aperture 7 is shown to be angled at 45 degrees relative to the x-direction and the y-direction, the sides are not necessarily angled at 45 degrees but it may have the sides angled at certain degrees proximal to the angles in conformity with patterned sides, for example, 30 or 60 degrees.

The electron beam, once having passed through the rectangular aperture 6 or the rectangular aperture 7 to be shaped into a rectangular shape, is then reduced with a reduction lens 9 and an objective lens system 10 into an image on a mask 16 (A step of focusing the electron beam by the objective lens to irradiate the sample). The objective lens system 10 defines an uni-potential lens system having three electrodes designed to have a particularly small bore and a particularly large lens gap. Onto a back surface of the sample or the mask 16 has been blown a cooling gas 17 to prevent a temperature rise. Further, the mask 16 is applied with a negative voltage by a negative power supply 15.

Since the cathode of the electron gun has a voltage of 4500V and the mask 16 is being applied with a voltage of −4000V, the sample is resultantly irradiated with 500 eV of energy. With 500 eV of energy, the extent of back scattered electrons in Cr of a light absorbing material of the mask 16 is limited to 50 nm or shorter, which allows a sufficiently precise processing of the mask to be carried out. The voltage of the cathode of the electron gun (acceleration voltage for the electron beam) is in a range of 0.5 to 10 kV, and the potential of the wafer could be variable in a range of 0 to −5 kV. An etching gas represented by halogen gases, such as chlorine or fluorine gases, is injected onto an electron beam Irradiated surface of the sample from a gas injection tube 13 serving as a gas supply (A step of supplying the reactive gas onto the electron beam irradiated surface of the sample). The gas used herein is not limited, but any types of gas may be used so far as it can provide etching process with the aid of the EB irradiation, including hydrogen and oxygen. A low vacuum exhaust pipe 12 is coupled to a vacuum pump (not shown) for low vacuum operation, which serves as an exhaust system, while on the other hand, a high vacuum exhaust pipe 11 is coupled to a turbo-molecular pump (not shown), so that a differential exhaust system can prevent the reactive gas filling up over the electron beam irradiated surface from flowing toward the electron gun side (A step of providing a continuous exhausting operation by means of a differential exhaust system arranged in the objective lens so as to prevent the reactive gas supplied onto the electron beam irradiated surface from flowing toward the electron gun side). The objective lens system 10, that has been designed to have the particularly small bore diameter and the particularly large lens gap as mentioned above, can provide for an effective differential exhausting operation. The low vacuum exhaust pipe 14 is also coupled to the exhaust system. Besides, in order to prevent the primary beam from being blurred and the beam current contained in the beam having fine beam diameter from being reduced, a pressure of the gas over the sample surface is controlled to be a certain pressure level which is just sufficient to meet a pressure requirement for the etching. It is to be noted that the differential exhaust system is provided in the objective lens system in the illustrated embodiment, but it may be provided at any locations in the vicinity of the sample so far as the reactive gas supplied onto the sample surface can be exhausted effectively.

A deflector 20 and an E×B separator 18 allow scanning with the electron beam in any desired directions on the sample surface for providing the etching, and occasional SEM scanning can be applied to detect an end point of the etching (A step of selectively scanning the pattern to be repaired on the sample with the electron beam so as to repair the pattern by applying an etching or a deposition). At this time, the secondary electrons emanated from the sample surface pass through the objective lens system 10, deflected (toward the left in FIG. 1) by the E×B separator 18 and finally detected by a secondary electron detector 19 (SE detector). In this way, a SEM image can be obtained, and thus obtained SEM image can be monitored to see whether or not the Cr has been left in a region of the opaque defect. Further, upon detecting the end point of the etching, the gas supply from the gas injection tube 13 can be suspended immediately to thereby reduce the gas pressure in a short time to the pressure level for preventing the further etching process.

Furthermore, the voltage applied to each of the electrodes of the objective lens system 10 is limited to a value of voltage that would not induce an electric discharge. Further, from the fact that the break down voltage depends on a surface condition of the electrode, the respective electrodes of the objective lens 10 have been coated with gold or platinum.

Figure 2:
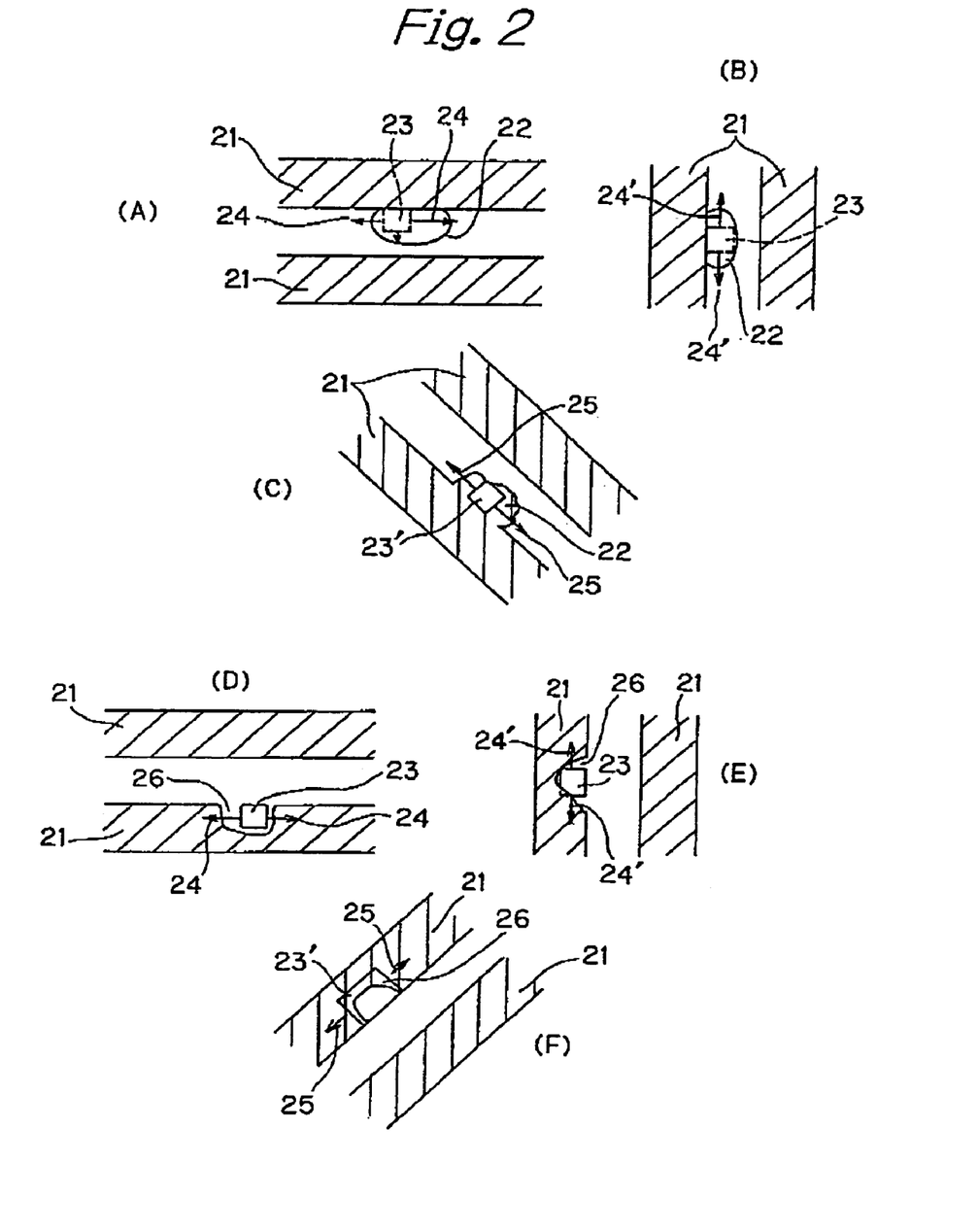
FIG. 2 provides schematic diagrams, specifically illustrating how a mask is repaired in a sample repairing method according to the present invention.

FIG. 2 shows, by way of example, how to repair an opaque defect and a clear defect. FIG. 2(A) shows a case of an opaque defect 22 adhering to a Cr pattern 21 extending along the x-direction. In this case, the scanning operation is performed with such a shaped beam 23 having a size about one half of a minimum line width, which has been shaped through the rectangular aperture 6 of the shaping aperture plate 5 into a rectangle having the sides extending in parallel in the x-direction and the y-direction, to be driven In the x-direction (the direction designated by reference numeral 24 in FIG. 2(A)) so as to apply the etching to peel away (repair) the opaque defect 22. FIG. 2(B) shows a case containing an opaque defect 22 adhering to a pattern 21 extending along the y-direction. In this case also, the scanning operation is performed with such a shaped beam 23 having a size about one half of a minimum line width, which has been shaped through the rectangular aperture 6 of the shaping aperture plate 5 into a rectangle having the sides extending in parallel in the x-direction and the y-direction, to be driven in the y-direction (the direction designated by reference numeral 24' in FIG. 2(B)) so as to apply the etching to peel away (repair) the opaque defect 22. FIG. 2(C) shows a case containing an opaque defect 22 adhering to a pattern 21 extending along the directions angled at 45 degrees relative to the x-direction and the y-direction. In this case, the scanning operation is performed with such a shaped beam 23', which has been shaped through the rectangular aperture 7 of the shaping aperture plate 5 into a rectangle having the sides angled at 45 degrees relative to the x-direction and the y-direction, to be driven in the directions angled at 45 degrees relative to the x-direction and the y-direction (the directions designated by reference numeral 25 in FIG. 2(C)) so as to apply the etching to peel away (repair) the opaque defect 22.

FIG. 2(D) shows, by way of example, a case for repairing a clear defect 26 in a pattern 21 extending along the x-direction, and in this case, the etching gas of halogens may be replaced with a gas capable of providing a deposition of tungsten metal. This gas may be such a gas that contains a metal and Is decomposed by the electron beam to form a deposition of metal, including carbonyls and methyls of metal, and the metal may be tungsten, copper, noble metals such as silver, aluminum or chrome. In case of FIG. 2(D), the scanning operation is performed with such a shaped beam 23, which has been shaped through the rectangular aperture 6 of the shaping aperture plate 5 into a rectangle having the parallel sides in the x-direction and the y-direction, to be driven in the x-direction (the direction designated by reference numeral 24 in FIG. 2(D)) so as to repair a clear defect 26. FIG. 2(E) shows a case for repairing a clear defect 26 in a pattern extending along the y-direction. In this case also, the scanning operation is performed with such a shaped beam 23, which has been shaped through the rectangular aperture 6 of the shaping aperture plate 5 into a rectangle having the sides extending in parallel in the x-direction and the y-direction, to be driven in the y-direction (the direction designated by reference numeral 24' in FIG. 2(E)) so as to repair the clear defect 26. FIG. 2(F) shows a case for repairing a clear defect 26 in a pattern 21 extending along the directions angled at 45 degrees relative to the x-direction and the y-direction. In this case, the scanning operation is performed with such a beam 23', which has been shaped through the rectangular aperture 7 of the shaping aperture plate 5 into a rectangle having the sides angled at 45 degrees relative to the x-direction and the y-direction, to be driven in the direction angled at 45 degrees relative to the x-direction and the y-direction (the direction designated by reference numeral 25 in FIG. 2(F)) so as to repair the clear defect 26.

Figure 3:
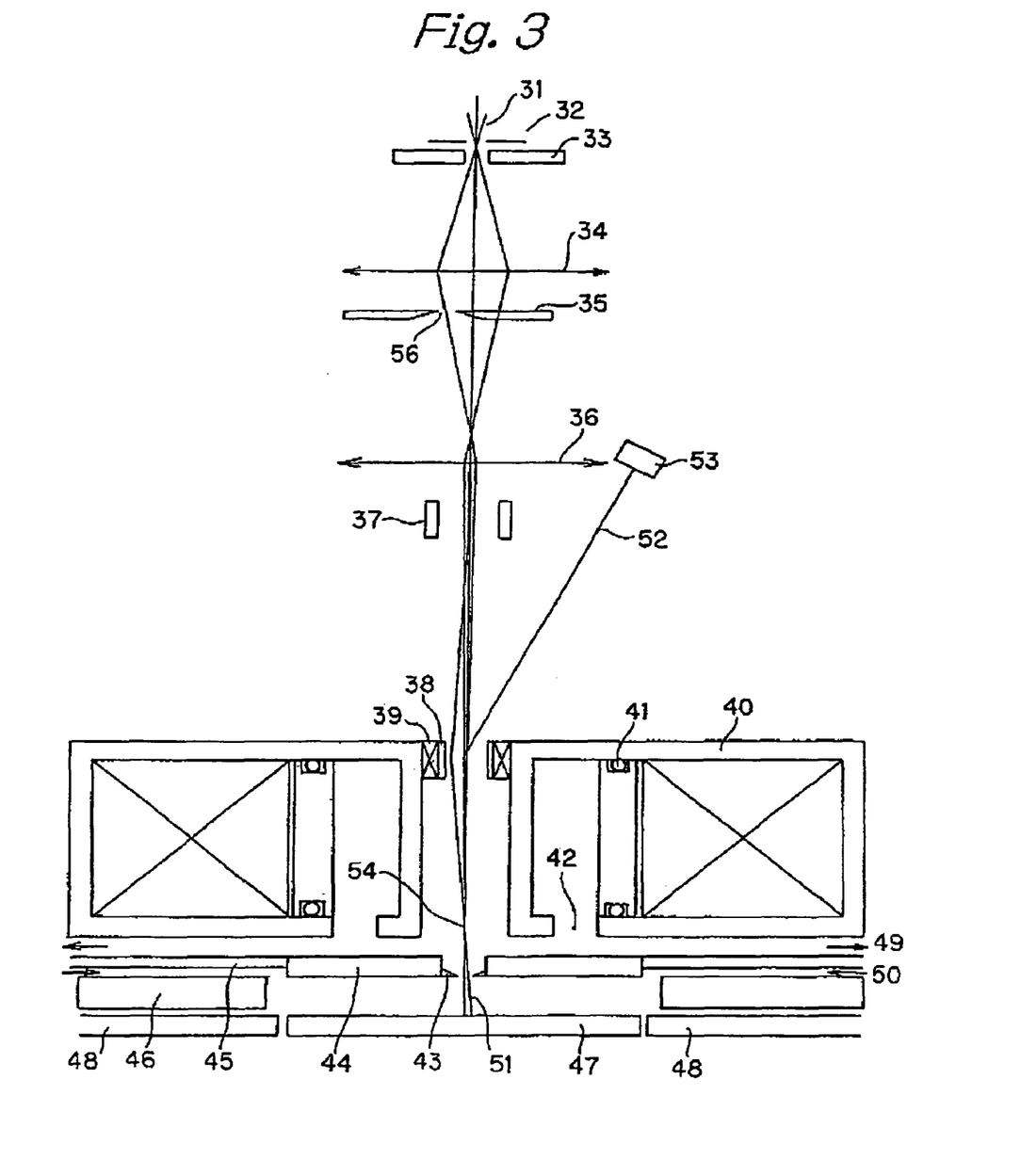
FIG. 3 is a schematic diagram illustrating another exemplary electron beam apparatus (i.e. an electron beam optical column) to be used in a sample repairing method according to the present invention.

Another embodiment of a sample repairing method according to the present invention will now be described. FIG. 3 shows schematically an electron beam apparatus (electron beam optical column) used in the repairing method for repairing defects in a mask, in which an electron beam that has been focused to be finer by an objective lens is irradiated onto the mask so as to repair the defect therein. A cathode 31 has employed a Schottky cathode of Zr/O-W or a thermal field emission cathode of TaC. Reference numeral 32 designates a Wehnelt or Schottky shield, and reference numeral 33 designates an anode. An electron gun comprises the cathode 31, the Wehnelt or Schottky shield 32 and the anode 33, and is configured for emitting electron beams from the Z-W Schottky cathode or the TaC cathode 31 to the directions away from the optical axis, for example, in four directions away from the optical axis, in which those electron beams emitted from the electron gun are focused by the condenser lens 34. This condenser lens 34 is made of electromagnetic lens which is capable of not only focusing the electron beams but also adjusting a rotational displacement of each electron beam in the azimuthal direction.

Figure 4:
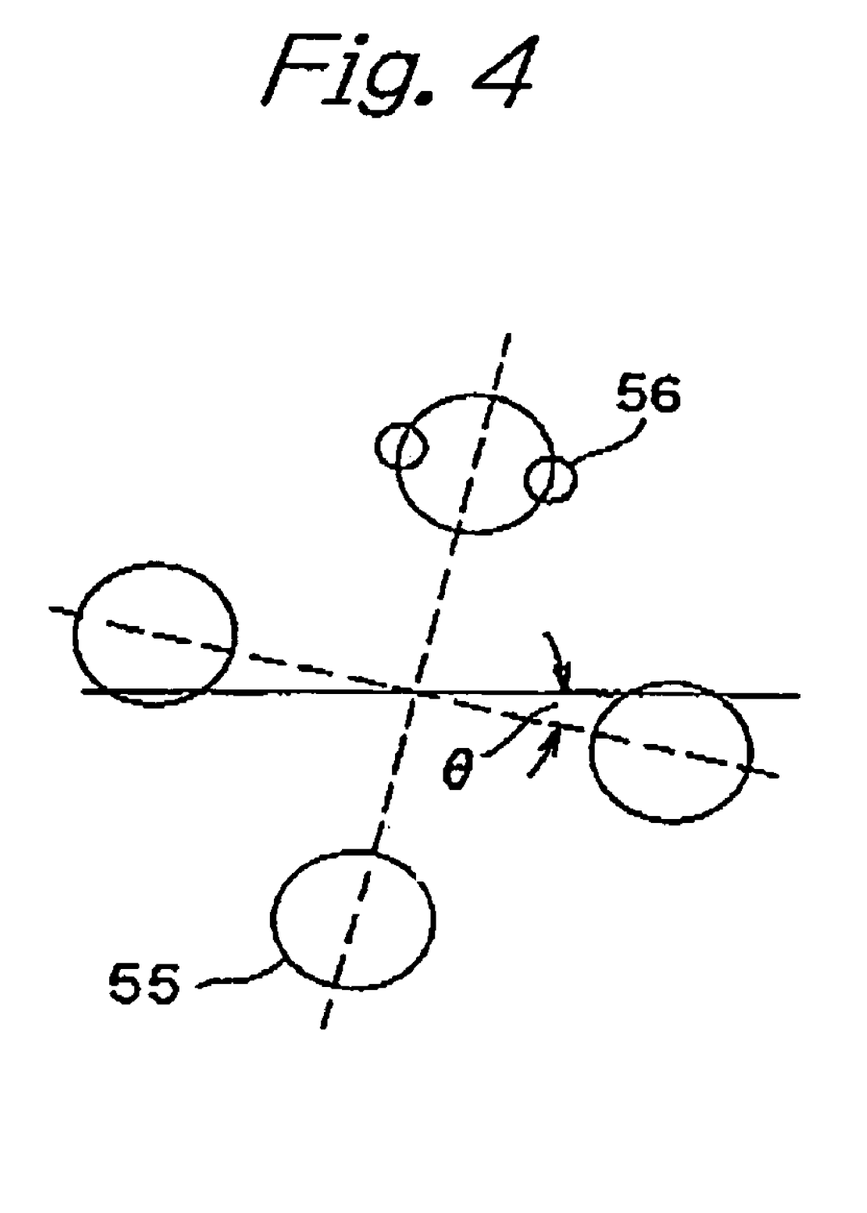
FIG. 4 shows an exemplary arrangement of apertures in a shaping aperture plate, which may be used in the above electron beam apparatus according to the present invention.

A shaping aperture plate 35 is disposed in the sample (mask) side of the condenser lens 34. An aperture 56 is formed In the shaping aperture plate 35. As shown in FIG. 4, at least one aperture 56 is formed in the shaping aperture plate 35 in a location offset from the optical axis so as to permit one of four beam 55 that have been emitted from the electron gun in four different directions away from the optical axis to pass through the aperture 56. Accordingly, an ion beam along the optical axis, which otherwise Is to flow toward the electron gun, can be blocked. The beam passes through either one of the apertures 56 in the shaping aperture plate 35 and is reduced by means of a reduction lens 36 and an objective lens (an electromagnetic lens for an objective lens) 40, and thereby the beam is irradiated onto the mask 47 (sample to be repaired) as a beam of small-diameter in the order of about 50 nm. That is, the electron beam that has been focused to be finer by the objective lens 40 is irradiated onto the mask 47 (A step of focusing the electron beam emitted from the electron gun to be finer by means of at least the objective lens to irradiate the sample).

Using a two-stage deflector system including an electrostatic deflector 37 and an E×B separating and scanning electrostatic deflector 38 disposed on the objective lens 40 defined in the electron gun side, the mask 47 is scanned in the two-dimensional manner to allow the secondary electrons emanating from the mask 47 surface (sample) to pass through a small aperture 43, then to be deflected toward the direction of the secondary electron locus 52 by the E×B separating and scanning electrostatic deflector 38 and the E×B separating deflector (electromagnetic deflector) 39 and finally to be detected by the secondary electron detector (SE detector) 53. Through those steps, a SEM image can be obtained (A step of obtaining the SEM image of the sample) and the obtained SEM image can be monitored to search for a region to be repaired. If the region to be repaired is located, the scanning is applied only to that region (A step of searching for the region to be repaired on the sample from the SEM image of the sample and scanning the region to be repaired by the electron beam) and an reactive gas is introduced from a gas introduction tube 50 serving as a gas supply (A step of increasing a pressure of the reactive gas in the region on the sample subject to the scanning with the electron beam) to apply an etching (electron beam-assisted etching) or a deposition (electron beam-assisted deposition) thereto. Further, after the repairing operation has been completed, the SEM image is obtained again and the checking operation Is performed over the SEM image to see whether or not the repairing has been accurately completed (A step of confirming the completion of the repairing of the sample).

Since a small aperture (an aperture for NA and for limiting a pressure) 43 is disposed between the mask 47 and the objective lens and so the region defined in the electron gun side is kept in high vacuum with the aid of the small aperture 43, even when the gas is introduced, therefore the beam would not be blurred but can be focused to be finer, thereby providing a precise repairing. Further, since a distance between the small aperture 43 and the mask 47 is short, a magnitude of blur of the beam, if any, could be limited to an extremely minute magnitude.

The objective lens 40 for focusing said electron beam to be finer comprises a magnetic lens (electromagnetic lens) 40 including a magnetic gap 42 formed therein defined in the mask 47 side and an axially symmetric electrode 44 disposed in the mask 47 side with respect to the magnetic lens 40 and having a potential higher than that of the mask 47. Since the negative voltage in the order of −4000V is applied to the mask 47 and the positive high voltage is applied to the electrode 44, therefore even with the landing energy not higher than 1 keV, it will be still possible to focus the beam to be sufficiently finer. Further, since a locus 51 during the scanning defines a pivot point 54 of deflection in the electron gun side with respect to the small aperture 43, an aberration during the deflection can be reduced.

A pressure wall 45 and a pressure bulkhead 46 define a partition wall for separating an exhaust pipe 49 coupled to a vacuum pump (not shown) and a gas introduction tube 50 from each other and are made of insulating material. A guard ring 48 is disposed below the pressure bulkhead 46 to reduce a space with respect to the pressure bulkhead 46, which also helps prevent a large amount of gas from flowing into a region defined in a sample chamber side. Further, an O-ring 41 is provided to separate a coil of the magnetic lens 40 from the vacuum environment.

Since the system uses only one of four beams emitted from the Zr/O-W Schottky cathode of the electron gun in four different directions angled with respect to the optical axis is used, the beam of high intensity can be used, which means that even with the beam that has been focused to 50 nm, a beam current equal to or more than 500 nA can be still obtained. Accordingly, the repairing operation can be carried out with high throughput, and also the observation of the SEM image can be carried out with good S/N ratio even with the beam focused for detecting the end-point. Since it is not known that in which direction of the azimuthal angles θ of the beams emitted from the Zr-W Schottky cathode of the electron gun in four directions away from the optical axis the stronger beam 55 is shot, a plurality of apertures 56 (two in the illustrated embodiment) of the shaping aperture plate 35 can be disposed in the direction of the azimuthal angles θ of the beam, which are spaced from each other by a distance corresponding to a diameter of the beam on the shaping aperture plate 35, as shown in FIG. 4. With this arrangement, a rotational amount to be adjusted by the condenser lens (magnetic lens) 34 can be reduced, It is to be noted that although the Illustrated embodiment shows an example using an inspection apparatus of the SEM type (scanning electron microscope), the present invention is not limited thereto but is applicable to the inspection apparatus of projecting optical system using the principle of parallel image-taking and to the inspection apparatus by ion beam using ions (referred to as a charged particle beam including an electron beam) or by light beam using light.

It is to be noted that although the description has been directed to the repairing operation applied to the mask in the above-Illustrated embodiments, the present invention is not limited to this but is applicable to a wafer in the course of fabrication of an advanced device (GaAs wafer in the course of fabrication of a discrete device).

Figure 5:
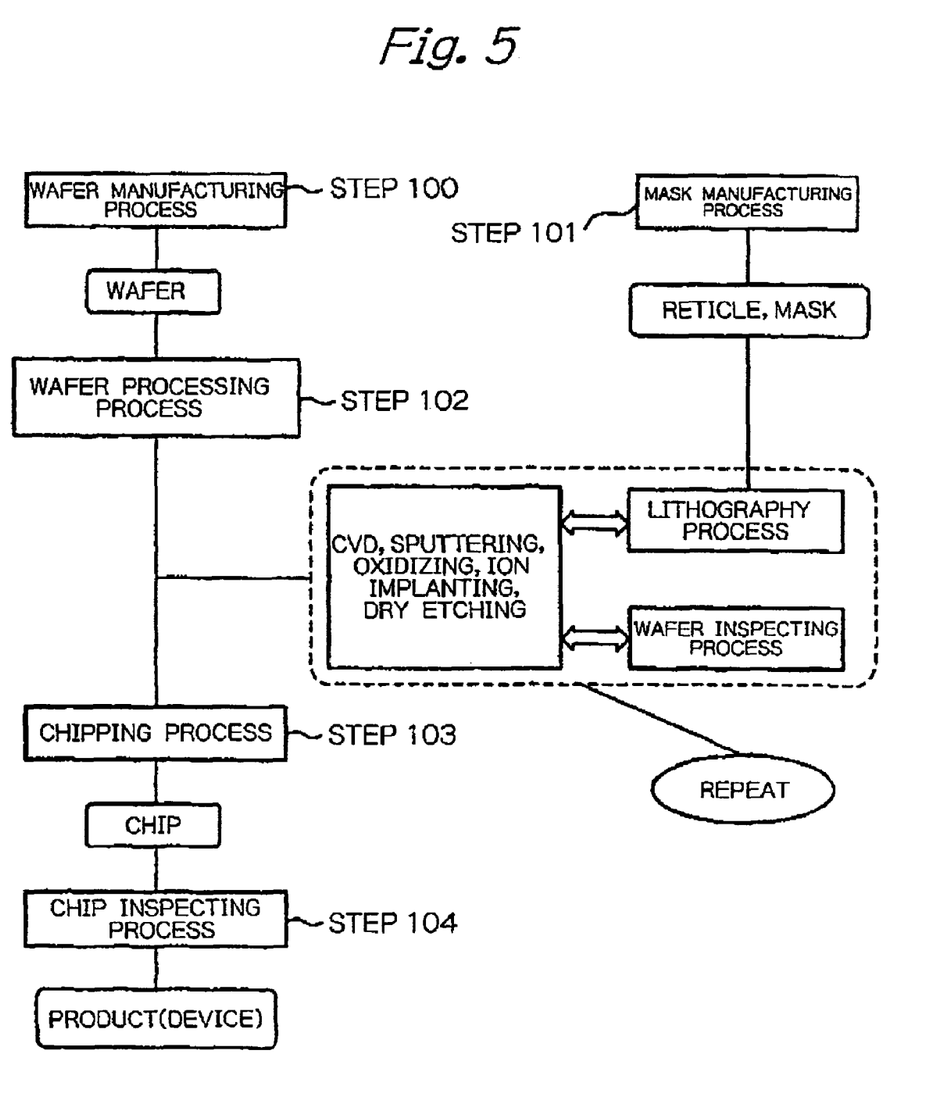
FIG. 5 is a flow chart illustrating, by way of example, a semiconductor device manufacturing method.
Figure 6:
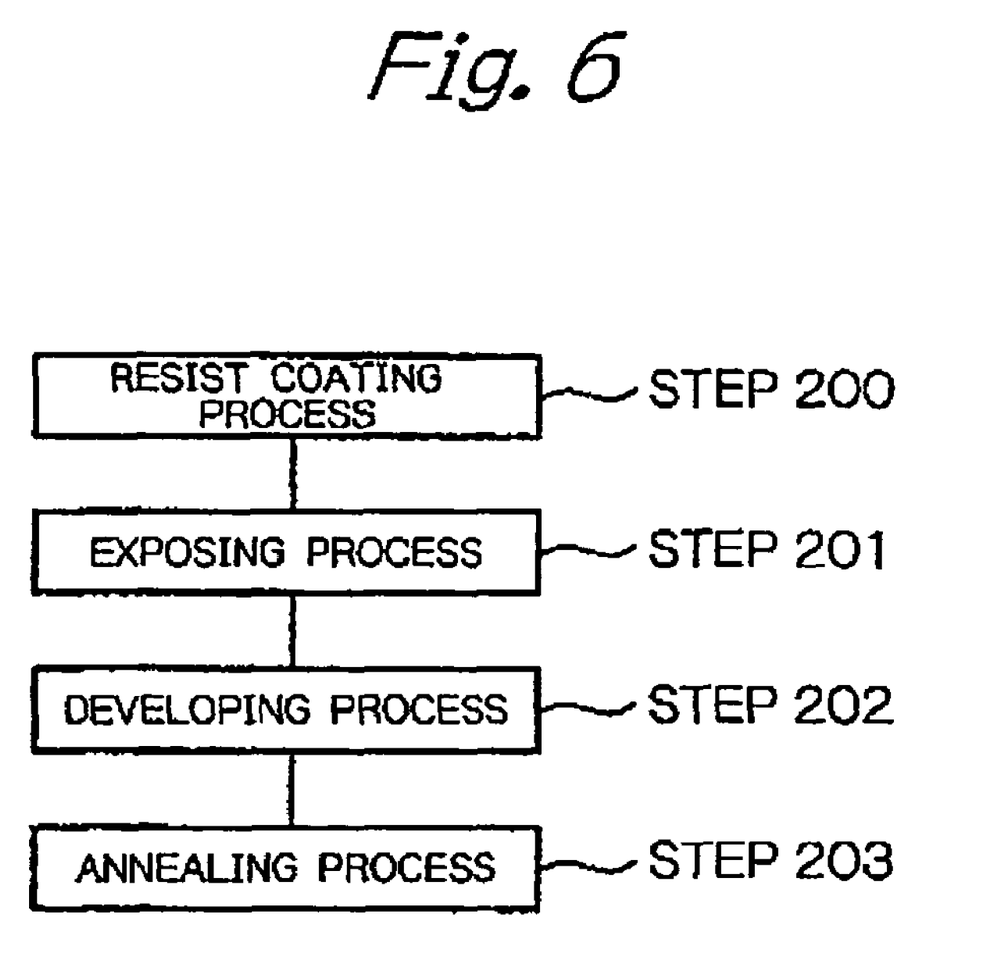
FIG. 6 is a flow chart illustrating a lithography process in the semiconductor device manufacturing method of FIG. 5.

By using the mask repaired by the above-described sample repairing method, a well-performed lithography can be carried out in the device manufacturing method. With reference to FIGS. 5 and 6, the description will now be directed to an embodiment for carrying out a method for manufacturing a semiconductor device by using a mask repaired by the above-described sample repairing method. FIG. 5 is a flow chart showing an embodiment of a manufacturing method of a semiconductor device according to the present invention. The manufacturing process in this embodiment includes the following main processes.

(1) A wafer manufacturing process for manufacturing a wafer (or wafer preparing process for preparing a wafer). (Step 100)

(2) A mask manufacturing process for fabricating a mask to be used in the exposure (or a mask preparing process for preparing a mask). (Step 101)

(3) A wafer processing process for performing any processing treatments necessary for the wafer. (Step 102)

(4) A chip assembling process for cutting out those chips formed on the wafer one by one to make them operative. (Step 103)

(5) A chip inspection process for inspecting an assembled chip. (Step 104)

It is to be appreciated that each of those main processes further comprises several sub-processes.

Among those main processes, one that gives a critical affection to the performance of the semiconductor device is (3) the wafer processing process. In this wafer processing process, the designed circuit patterns are deposited on the wafer one on another, thus to form many chips, which will function as memories or MPUs. This wafer processing process includes the following sub-processes.

(A) A thin film deposition process for forming a dielectric thin film to be used as an insulation layer, a metallic thin film to be formed into a wiring section or an electrode section, and the like (by using the CVD process or the sputtering).

(B) An oxidizing process for oxidizing the wafer substrate, which is another means to form those thin films.

(C) A lithography process for forming a resist pattern by using a mask (reticule) in order to selectively process the thin film layers and/or the wafer substrate.

(D) An etching process for processing the thin film layer and/or the wafer substrate in conformity to the resist pattern (by using, for example, the dry etching technology).

(E) An ions/impurities implant and diffusion process.

(F) A resist stripping process.

(G) An inspection process for inspecting the processed wafer.

It is to be noted that the wafer processing process must be performed repeatedly as desired depending on the number of layers contained in the wafer, thus to manufacture the device that will be able to operate as designed.

A flow chart of FIG. 6 shows the lithography process included as a core process in said wafer processing process. The lithography process comprises the respective processes as described below.

(a) A resist coating process for coating the wafer having a circuit pattern formed thereon in the preceding stage with the resist. (Step 200)

(b). An exposing process for exposing the resist. (Step 201)

(c) A developing process for developing the exposed resist to obtain the pattern of the resist. (Step 202)

(d) An annealing process for stabilizing the developed pattern. (Step 203)

All of the semiconductor device manufacturing process, the wafer processing process, and the lithography process described above are well-known, and so any further description on them should not be necessary.

When a defect inspection method and a defect inspection apparatus according to the present invention is used in the above-described inspection process of (G), any defects can be detected with high throughput even on a semiconductor device having a fine pattern, enabling the 100-percent inspection and thus the improvement in yield of the products as well as the avoidance of shipping of any defective products to be achieved.

What is claimed is:

1. A sample repairing method, comprising:
   (a) irradiating a sample having at least one pattern with an electron beam focused by an objective lens;
   (b) supplying a reactive gas onto a surface of said sample irradiated with the electron beam;
   (c) shaping the electron beam by a shaping aperture plate, said shaping aperture plate having a first shaping aperture a side of which is angled at a predetermined degree proximal to an angle of a side of said pattern formed on the sample;
   (d) selectively scanning said pattern so as to repair said pattern by etching or applying deposition; and
   (e) providing a continuous exhaust operation by means of a differential exhaust system arranged in said objective lens so as to prevent the reactive gas supplied onto said surface irradiated with the electron beam from flowing toward an electron gun side.

2. A sample repairing method in accordance with claim 1, in which said sample is applied with a negative voltage.

3. A sample repairing method in accordance with claim 1, in which a landing energy of said electron beam is equal to or less than 3 keV.

4. A sample repairing method in accordance with claim 1, in which said shaping aperture plate has a second shaping aperture a side of which is angled at another predetermined degree.

5. A device manufacturing method comprising:
   preparing wafers;
   preparing a mask or reticule;
   repairing said mask or reticule using a repairing method defined in claim 1;
   carrying out a lithography for said wafers by using said repaired mask or wafer; and
   assembling devices using said processed wafers.

6. A sample repairing method, comprising the steps of:
   (a) irradiating a sample having at least one pattern with an electron beam emitted from an electron gun through an objective lens;
   (b) obtaining an image of said sample surface;
   (c) searching for a region to be repaired on said sample from said image of said sample surface and scanning said region to be repaired by the electron beam;
   (d) increasing a pressure of a reactive gas in said region on said sample subject to the scanning with the electron beam;
   (e) shaping the electron beam by a shaping aperture plate, said shaping aperture plate having a first shaping aperture a side of which is angled at a predetermined degree proximal to an angle of a side of said pattern formed on the sample;
   (f) selectively scanning said pattern so as to repair said pattern by etching or apply deposition; and
   (g) confirming the completion of said repairing of said sample, wherein a small aperture for limiting the pressure is disposed between said sample and said objective lens.

7. A sample repairing method in accordance with claim 6, in which said electron gun has a ZrO/W Schottky cathode or a TaC cathode, and said electron gun emits four beams in four different directions angled with respect to an optical axis.

8. A sample repairing method in accordance with claim 6, which said objective lens for focusing said electron beam to be finer comprises:
   a magnetic lens having a magnetic gap formed in the sample side thereof; and
   an axially symmetric electrode disposed in the sample side of said magnetic lens and having a potential higher than that of the sample.

9. A sample repairing method in accordance with claim 6, in which
   a beam separator is provided in the electron gun side of said objective lens or inside said objective lens, and
   said step of obtaining the image of said sample surface includes a step of deflecting secondary electrons emitted from said sample, by said beam separator and detecting said secondary electrons by a detector to thereby obtain the image of said sample surface.

10. A sample repairing apparatus for repairing a sample, comprising:
    an electron gun for emitting an electron beam;
    an objective lens for focusing the electron beam to irradiate a sample having at least one pattern;
    a shaping aperture plate for shaping the electron beam, said shaping aperture plate having a first shaping aperture a side of which is angled at a predetermined degree proximal to an angle of a side of said pattern formed on the sample;
    a gas supply for supplying a reactive gas onto a surface of said sample irradiated with the electron beam; and
    a differential exhaust system disposed in said objective lens and operative to keep exhausting the reactive gas so as to inhibit the reactive gas supplied onto said surface irradiated with the electron beam by said gas supply from flowing toward an electron gun side, wherein
    said pattern to be repaired on said sample is selectively scanned with the electron beam so as to repair said pattern by etching or applying deposition.

11. A sample repairing apparatus in accordance with claim 10, in which said sample is applied with a negative voltage.

12. A sample repairing apparatus in accordance with claim 10, in which a landing energy of said electron beam is equal to or less than 3 keV.

13. A sample repairing apparatus in accordance with claim 10, in which said shaping aperture plate comprises a second shaping aperture a side of which is angled at another predetermined degree, wherein
    said first shaping aperture and said second shaping aperture are switchable from each other.

14. A sample repairing apparatus in accordance with claim 13, in which said electron gun has a ZrO.W Schottky cathode or a TaC cathode, and an electron beam emitted in a direction away from an optical axis is used.

15. A sample repairing apparatus in accordance with claim 13, in which said objective lens for focusing said electron beam to be finer comprises:

a magnetic lens having a magnetic gap formed in a sample side thereof; and an axially symmetric electrode disposed in the sample side of said magnetic lens and having a potential higher than that of the sample.

16. A sample repairing apparatus in accordance with claim 13, in which a beam separator is provided in the electron gun side of said objective lens or inside said objective lens, and said image obtaining means for obtaining the image of said sample surface obtains the image of the sample surface through the steps of deflecting secondary electrons emitted from said sample, by said beam separator and detecting said secondary electrons by a detector.

17. A sample repairing method, comprising:

(a) irradiating a sample having at least one pattern with an electron beam focused by an objective lens;

(b) supplying a reactive gas onto a surface of said sample irradiated with the electron beam;

(c) shaping the electron beam by a shaping aperture plate, said shaping aperture plate having a first shaping aperture a side of which is angled at a predetermined degree proximal to an angle of a side of said pattern formed on the sample; and (d) selectively scanning said pattern with the electron beam so as to repair said pattern by etching or apply deposition.

* * * * *